United States Patent
Hong

[11] Patent Number: 6,060,366
[45] Date of Patent: May 9, 2000

[54] METHOD FOR MANUFACTURING DRAM CAPACITOR INCORPORATING LIQUID PHASE DEPOSITION

[75] Inventor: Gary Hong, Hsin-Chu, Taiwan

[73] Assignee: United Semiconductor Corp., Hsin-Chu, Taiwan

[21] Appl. No.: 09/058,579

[22] Filed: Apr. 10, 1998

[30] Foreign Application Priority Data

Feb. 6, 1998 [TW] Taiwan .................................. 87101557

[51] Int. Cl.⁷ .................................................. H01L 21/20
[52] U.S. Cl. ........................... 438/397; 438/497; 257/306
[58] Field of Search .................................... 438/253, 255, 438/396, 397, 497, 500

[56] References Cited

U.S. PATENT DOCUMENTS

| 5,529,946 | 6/1996 | Hong | 438/253 |
| 5,733,808 | 3/1998 | Tseng | 438/239 |
| 5,780,334 | 7/1998 | Lim et al. | 438/239 |

*Primary Examiner*—Wael Fahmy
*Assistant Examiner*—William David Coleman
*Attorney, Agent, or Firm*—Thomas, Kayden, Horstemeyer & Risley

[57] ABSTRACT

A method for forming a DRAM capacitor comprising the steps of first depositing conductive material over a dielectric layer and into a contact opening already formed in the dielectric layer, then patterning the conductive layer using a photoresist layer. Next, a portion of the photoresist layer is removed to expose a peripheral strip on the upper surface of the conductive layer. Then, a liquid-phase deposition method is used to deposit a silicon oxide layer over the conductive layer and the dielectric layer. Due to the selectivity of liquid-phase deposition method, none of the silicon oxide layer is deposited over the photoresist layer. Hence, after the removal of the photoresist layer, the silicon oxide layer can be used as a mask for patterning the conductive layer again. The patterned conductive layer then becomes the cylindrical-shaped storage electrode of a DRAM capacitor.

31 Claims, 4 Drawing Sheets

METHOD FOR MANUFACTURING DRAM CAPACITOR INCORPORATING LIQUID PHASE DEPOSITION

CROSS-REFERENCE TO RELATED APPLICATION

This application claims the priority benefit of Taiwan application serial no. 87101557, filed Feb. 6, 1998, the full disclosure of which is incorporated herein by reference.

BACKGROUND OF THE INVENTION

1. Field of Invention

The present invention relates to a method for manufacturing integrated circuits. More particularly, the present invention relates to a method for forming a dynamic random access memory (DRAM) capacitor that utilizes a liquid-phase deposition method for selectively depositing silicon dioxide onto the required layer.

2. Description of Related Art

As the microprocessor of a computer becomes more powerful, the amount of software programs that can be run inside a computer simultaneously increases exponentially. Consequently, the amount of memory space necessary for storing data must also be increased, and highly efficient memory capacitors are in great demand. As the level of integration of DRAMs increases, DRAM cells are now constructed from just one transfer field effect transistor and a storage capacitor. FIG. 1 is an equivalent circuit diagram of a DRAM cell. A DRAM is normally constructed from an array of these cells. A binary bit is stored in the capacitor C of each cell. In general, when the capacitor C is uncharged, a logic state of "0" is defined. On the other hand, when the capacitor C is fully charged, a logic state of "1" is defined. A capacitor C has an upper electrode (cell electrode) 100 and a lower electrode (storage electrode) 102 with a layer of dielectric 101 sandwiched between the two to provide the necessary dielectric constant. In addition, the capacitor C is coupled to a bit line (BL), and reading and writing to and from the DRAM memory is achieved by charging or discharging the capacitor C. Charging and discharging of the capacitor is carried out through the control of a transfer field effect transistor T (TFET). The source terminal of the transfer transistor is connected to the bit line BL while the drain terminal of the transfer transistor is connected to the capacitor C. The transfer transistor is switched on or off through a selection signal coming from a word line WL, which is connected to the gate terminal of the transfer transistor. Hence, whether the capacitor C is connected to the bit line allowing for charging or discharging of the capacitor depends upon the selection signal passed to the gate terminal.

A conventional DRAM having storage capacity smaller than one megabit (Mbits) has two-dimensional capacitors, commonly referred to as a planar type of capacitor. However, a planar type capacitor occupies lots of substrate area, and so is unsuitable for high level integration. Highly integrated DRAM circuits, for example, those with memory having a storage capacity larger than about four Mbits, need three-dimensional capacitors. Three-dimensional capacitor constructs include the stacked type and the trench type.

Compared with a planar type of capacitor, a stacked type or a trench type of capacitor is able to provide the same capacitance to a capacitor despite a dimensional reduction. However, when the scale of integration for memory devices is further increased, for example, DRAM memory that can store up to 64 Mbits, even a simple three-dimensional capacitor construct is not enough.

One method of further increasing the surface area of the lower electrode, hence increasing the capacitance of a capacitor, is to develop horizontal extensions and then stacking them one over the other as in a fin-type of stacked capacitor. Description of this type of design appears in an article by Ema et al. with the title "3-Dimensional Stacked Capacitor Cell for 16M and 64M DRAMs", published in International Electron Devices Meeting, pp 592–595, December 1988, or U.S. Pat. No. 5,071,783, U.S. Pat. No. 5,126,810 and U.S. Pat. No. 5,206,787.

Another method is to allow the electrode and the dielectric film of the capacitor to extend vertically up to form a vertical structure called a cylindrical stacked capacitor. Description of this type of design appears in an article by Wakamiya et al. with the title "Novel Stacked Capacitor Cell for 64 Mb DRAM", published in Symposium on VLSI Technology Digest of Technical Papers, pp 69–70, 1989, or U.S. Pat. No. 5,077,688.

Yet, in the near future, the trend for integrating more and more devices into a wafer will continue, and the dimensions of a DRAM cell will shrink still further. As anybody familiar with the technologies may understand, shrinking of memory cell dimensions will lead to a further reduction of the capacitance for its capacitor. One consequence of this is the production of more soft errors due to an increased effect by alpha rays. Therefore, people engaged in the semiconductor industry are still searching for ways to increase the capacitance of a capacitor even though the available area is reduced.

In light of the foregoing, there is a need provide an improved method of fabricating a DRAM capacitor.

SUMMARY OF THE INVENTION

Accordingly, the present invention is to provide a method that utilizes the selective deposition properties of a liquid-phase deposition method to deposit silicon oxide in the fabrication of dynamic random access memory (DRAM) capacitor.

To achieve these and other advantages and in accordance with the purpose of the invention, as embodied and broadly described herein, the invention provides a method for manufacturing a DRAM capacitor. The method comprises the steps of providing a substrate, and then forming a field effect transistor above the substrate. Thereafter, a first dielectric layer, an inter-layer dielectric, and a second dielectric layer are sequentially formed over the substrate. Next, the second dielectric layer, the interlayer dielectric and the first dielectric layer are patterned to form a storage capacitor contact opening exposing the source/drain region of the field effect transistor. In the subsequent step, a conductive material is deposited into the contact opening forming a conductive layer that is electrically coupling with the exposed source/drain region. After that, a photoresist layer is formed over the conductive layer, and then the conductive layer is patterned. A portion of the photoresist layer is then removed exposing a portion of the upper peripheral surface of the conductive layer. Next, a silicon oxide layer is deposited over the exposed conductive layer using a liquid-phase deposition method. The silicon oxide layer can be deposited over the exposed conductive layer rather than the photoresist layer because liquid-phase deposition has such a selective property that none of the silicon oxide attaches to the photoresist layer. Subsequently, the photoresist layer is completely removed, and then a portion of the conductive layer is removed using the silicon oxide layer as a mask. Hence, a trench is formed in the conductive layer. The etched conductive layer becomes the storage electrode of the capacitor. Thereafter, using the inter-layer dielectric as an etching stop layer, the silicon oxide layer and the second dielectric layer are removed, exposing the conductive layer. Then, a dielectric film is formed over the exposed conductive layer. Finally, another conductive layer is formed over the dielectric film to form the cell electrode, completing the process of fabricating a cylindrical DRAM capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
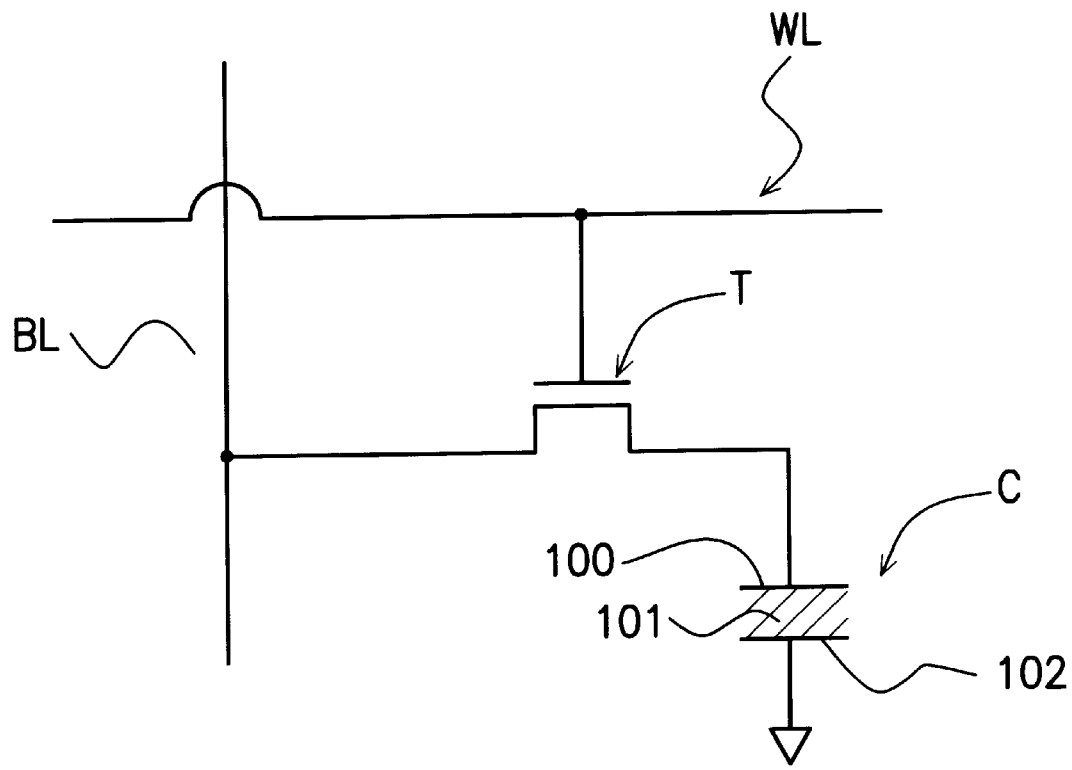
FIG. 1 is an equivalent circuit diagram for a DRAM cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in producing a cylindrical DRAM capacitor according to one preferred embodiment of this invention.

Figure 2A:
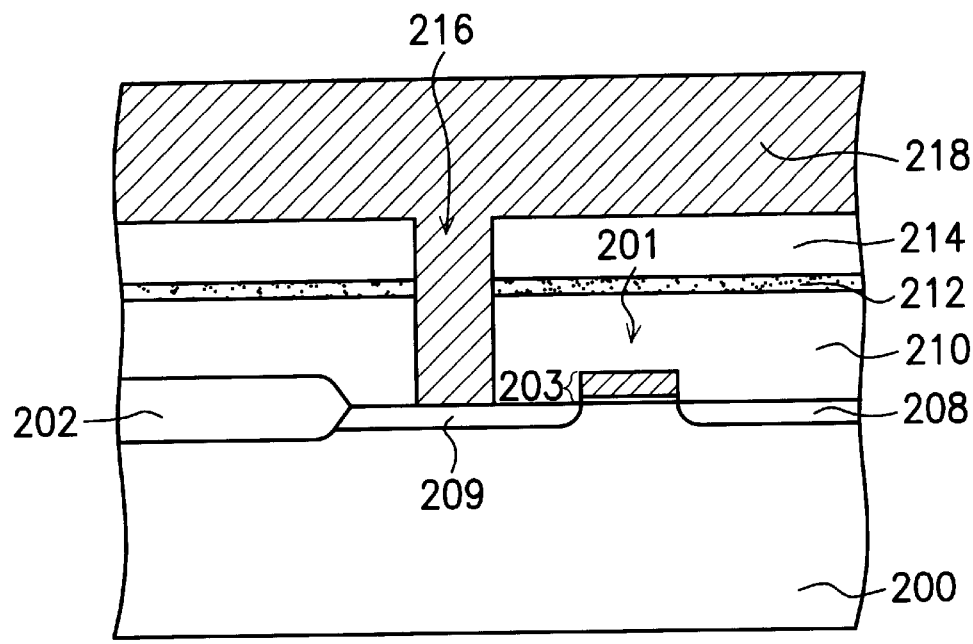
FIGS. 2A through 2E are cross-sectional views showing the progression of manufacturing steps in producing a cylindrical DRAM capacitor according to one preferred embodiment of this invention.

First, as shown in FIG. 2A, a DRAM field effect transistor 201 is formed over a substrate 200, for example, a P-type silicon substrate. The field effect transistor 201 having a gate structure 203 and source/drain regions 208 and 209 is formed in the active device region of the substrate 200 insulated from other regions by a field oxide layer 202. Then, a first dielectric layer 210, an inter-layer dielectric 212 and a second dielectric layer 212 are sequentially formed over the substrate 200. The first dielectric layer 210 can be a silicon oxide layer formed by a chemical vapor deposition (CVD) method, or can be a borophosphosilicate glass (BPSG) layer, for example. The interlayer dielectric 212 can be, for example, a silicon nitride layer formed by chemical vapor deposition (CVD) method. The second dielectric layer 214 can be, for example, a silicon oxide layer formed by a chemical vapor deposition method. Thereafter, conventional photolithographic and etching processes are used to pattern the second dielectric layer 214, the inter-layer dielectric 212 and the first dielectric layer 210 forming a storage electrode contact opening 216 that exposes a source/drain region 209. Subsequently, conductive material is deposited over the substrate 200 and completely fills the contact opening 216 using a low pressure chemical vapor deposition (LPCVD) method. The conductive material forms a conductive layer that is electrically coupled to a source/drain region 209. The conductive material can be, for example, a polysilicon with impurities implanted for increasing its electrical conductivity.

Figure 2B:
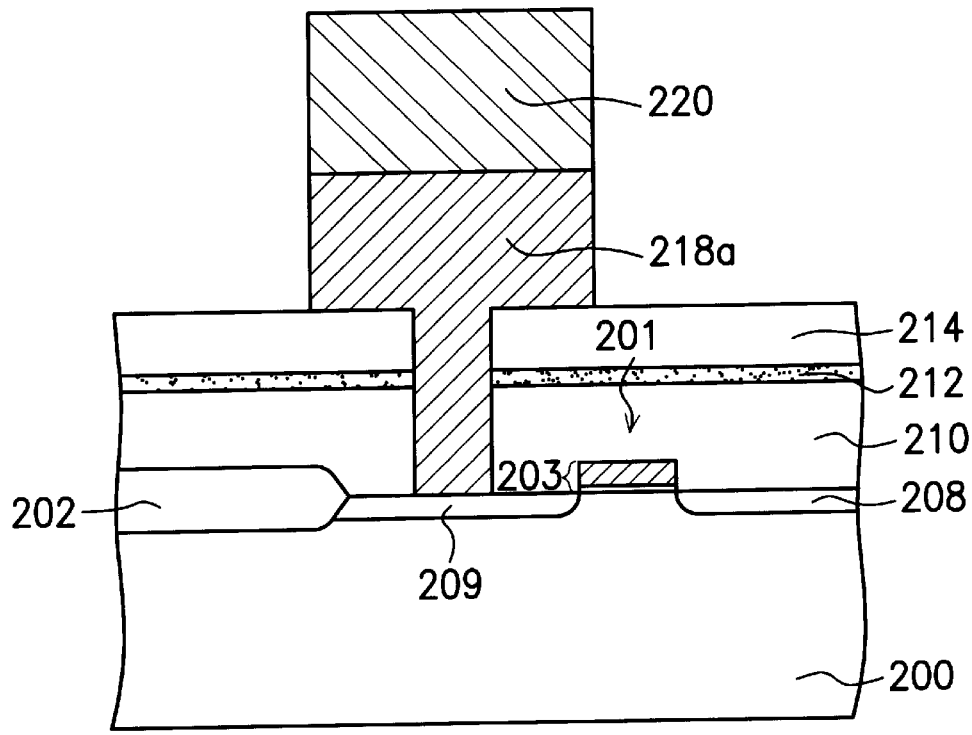

Next, as shown in FIG. 2B, conventional photolithographic technique is used to form a layer of photoresist 220 over the conductive layer 218. Then, using the photoresist layer 220 as a mask, the conductive layer 218 is patterned by etching to form a conductive layer 218a.

Figure 2C:
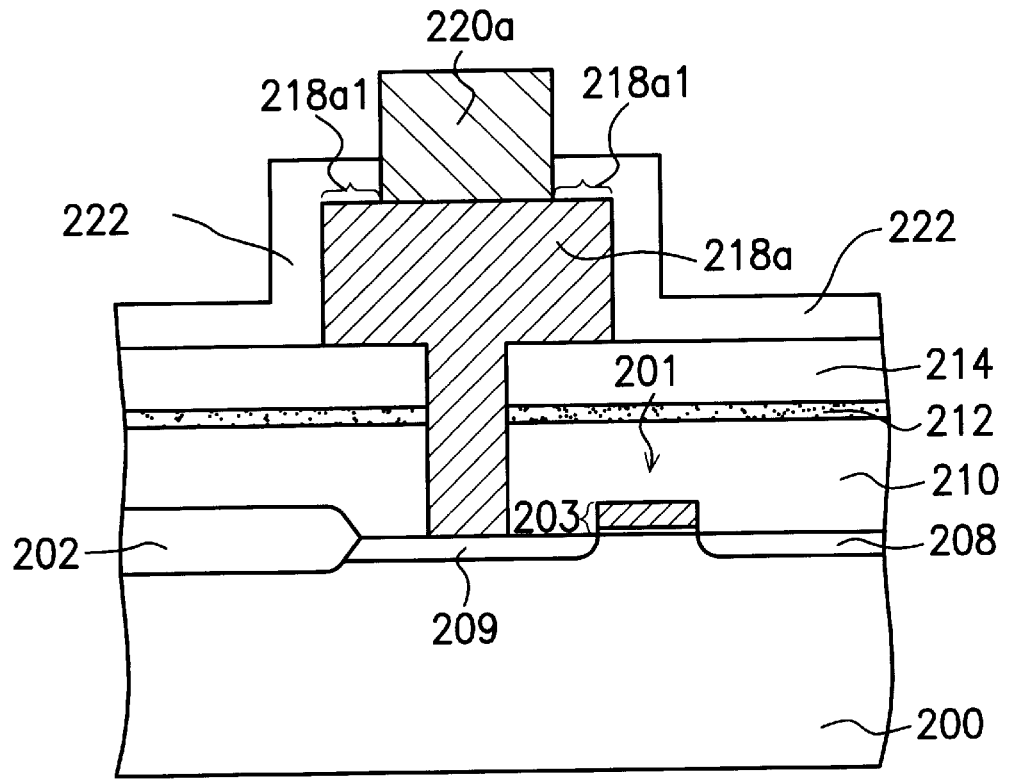

Thereafter, as shown in FIG. 2C, a portion of the photoresist layer 220 is removed using, for example, an isotropic etching with oxygen-containing plasma Area covered by the photoresist layer 220a is thereby shrunk exposing a peripheral strip 218a1 on the upper surface of the conductive layer 218a Thickness of the storage electrode is dependent upon the width of the peripheral strip 218a1. Next, a liquid-phase deposition method is used to deposit a silicon oxide layer 222 over the substrate 200 at room temperature. Because the silicon oxide layer 222 deposited by a liquid-phase deposition method tends not to attach to the surface of a photoresist layer, the silicon dioxide layer 222 is mainly deposited over the conductive layer 218a and the second dielectric layer 214 as shown in FIG. 2C. Properties and techniques of using liquid-phase deposition can be found in an article by Homma et al. published in J. Electrochem. Soc., Vol. 140, No. 8, August 1993 with the title "A selective SiO2 Film-Formation Technology Using Liquid-Phase Deposition for Fully Planarized Multilevel Interconnection".

Figure 2D:
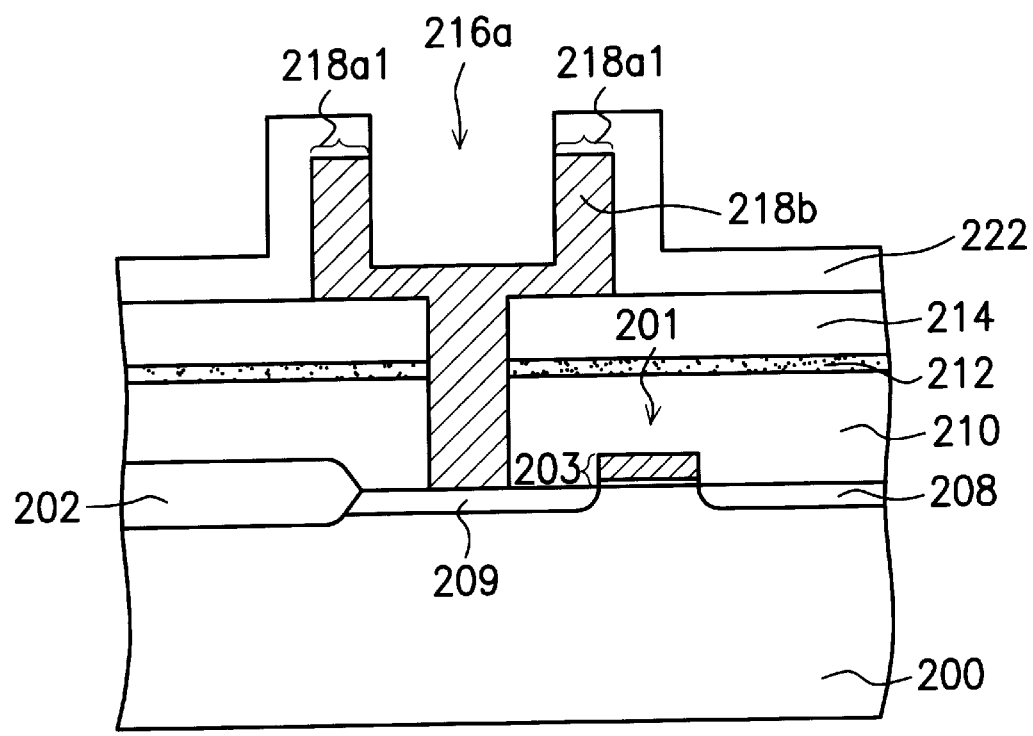

Next, as shown in FIG. 2D, the photoresist layer 220a is completely removed. Then, using the silicon oxide layer 222 as a mask, a portion of the conductive layer 218a is removed to form a trench 216a in the conductive layer 218a using, for example, an anisotropic etching operation. Finally, a conductive layer 218b with a cylindrical-shape is formed and acts as a storage electrode of the capacitor.

Figure 2E:
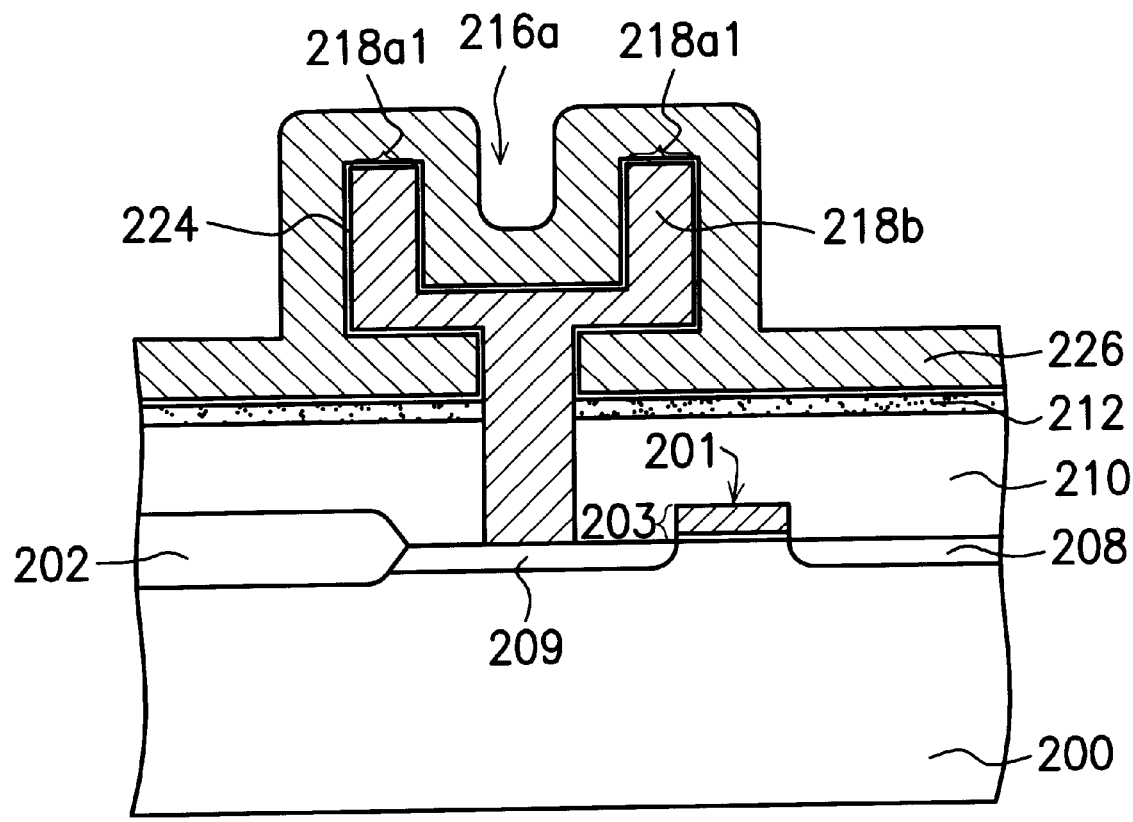

Thereafter, as shown in FIG. 2E, using the inter-layer dielectric 212 as an etching stop layer, the silicon oxide layer 222 and the second dielectric layer 214 is removed, for example, by an isotropic etching operation with a diluted hydrofluoric acid solution or a buffered oxide etchant (BOE). Consequently, the surface profile of the conductive layer 218b and the surface of the inter-layer dielectric 212 are exposed. In the subsequent step, a dielectric film 224 preferably having a thickness of about 10Å to 60Å is formed over the exposed surface of the conductive layer 218b. The dielectric film 224 can be a silicon oxide layer, a nitride/oxide (NO) composite layer or an oxide/nitride/oxide (ONO) composite layer. Furthermore, the dielectric film 224 can be formed from materials such as tantalum pentoxide ($Ta_2O_5$), $Pb(Zr,Ti)O_3$ or PZT and $(Ba,Sr)TiO_3$ or BST, all of which have very high dielectric constants. Thereafter, another conductive layer 226, for example, a metallic layer or a doped polysilicon layer, is formed over the exposed surface of the dielectric film 224, the conductive layer 226 acting as the cell electrode of the storage capacitor. The conductive layer 226 can be formed by first performing a chemical vapor deposition method, and then doping with impurities such as N-type arsenic ions to increase the electrical conductivity of the deposited polysilicon layer. Alternatively, the conductive layer 226 can be formed by depositing a metal nitride layer such as titanium nitride. Finally, conventional photolithographic and etching processes are used to pattern the conductive layer 226 to form a complete storage capacitor.

The embodiment of this invention can be applied to form a capacitor over bit-line (COB) or capacitor under bit-line (CUB) type of DRAM. Subsequently, although not shown in FIG. 2E, those who are familiar with the technology may realize that conventional techniques can be applied to form a bonding pad, interconnects, passivation layer and packaging necessary for completing the fabrication of a DRAM integrated circuit. Since these processing steps are outside the scope of this invention, detailed description is omitted here.

In the preferred embodiment of this invention, the doped impurities of the polysilicon conductive layers 218 and 226, beside arsenic ions and phosphorus ions, can be other types of ions having a similar properties. Furthermore, methods of doping impurities into the polysilicon layer besides the one described above can also include one of the following three types: (1) using an ion implantation method to implant the necessary impurities with the correct concentration level into the polysilicon layer; (2) using a chemical vapor deposition method to deposit polysilicon and at the same time doping the necessary impurities with the correct concentration level in the polysilicon layer; (3) using a chemical vapor deposition method to deposit a layer of polysilicon, and then using a heat diffusion method to diffuse the necessary impurities into the polysilicon layer up to the desired concentration level.

As a summary, the characteristics of DRAM capacitor manufacture in this invention include:

1. Thickness of the cylindrical-shaped storage electrode of the capacitor depends on the width of the peripheral strip 218a1 on the upper surface of the conductive layer 218a exposed by the partial etching of the photoresist layer 220. Because no photolithographic processing is necessary for determining the thickness of the storage electrode, the method of this invention is a much simpler process.

2. Shape of the cylindrical storage electrode is formed by removing a portion of the photoresist layer 220 after the first patterning of the conductive layer 218a. Utilizing the selective deposition property in a liquid-phase deposition method, silicon oxide is only formed over the exposed peripheral strip on the upper surface of the conductive layer 218a and not on the photoresist layer 220a itself Subsequently, after removing the photoresist layer 220a, isotropic etching is performed using the silicon oxide layer 222 as a mask to form a trench 216a in the conductive layer. The conductive layer formed by the above operations becomes the cylindrical-shaped storage electrode.

3. The fabrication process used in this invention is compatible with other conventional processes. Therefore, the procedures are easy to adopt in a production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor comprising the steps of:

providing a substrate having a field effect transistor formed thereon, wherein the field effect transistor includes source/drain regions;

forming an inter-layer dielectric over the substrate;

forming a first dielectric layer over the inter-layer dielectric;

patterning the first dielectric layer and the inter-layer dielectric to form a contact opening exposing one of the source/drain regions;

forming a first conductive layer over the first dielectric layer and completely filling the contact opening so that the first conductive layer is electrically coupled to the exposed source/drain region;

forming a photoresist layer over the first conductive layer;

pattern the first conductive layer using the photoresist as a mask to expose the first dielectric layer;

removing a portion of the photoresist layer to expose a strip on the periphery of the upper surface of the first conductive layer;

forming a silicon oxide layer over the first dielectric layer and the conductive layer using a liquid-phase deposition method;

removing the photoresist layer;

removing a portion of the first conductive layer using the silicon dioxide layer as a mask to form a storage electrode of the capacitor, wherein the thickness of the storage electrode is substantially equal to the width of the strip;

removing the silicon oxide layer and the first dielectric layer;

forming a dielectric film over the exposed surface of the first conductive layer; and forming a second conductive layer over the dielectric film for serving as a cell electrode.

2. The method of claim 1, wherein before the step of forming the inter-layer dielectric over the substrate, further includes forming a second dielectric layer over the substrate so that the inter-layer dielectric is now sandwiched between the upper first dielectric layer and the lower second dielectric layer.

3. The method of claim 2, wherein the step of forming the second dielectric layer includes depositing silicon dioxide.

4. The method of claim 2, wherein the step of forming the second dielectric layer includes depositing borophosphosilicate glass.

5. The method of claim 1, wherein the inter-layer dielectric and the first dielectric layer are formed from different materials.

6. The method of claim 1, wherein the step of forming the inter-layer dielectric includes depositing silicon nitride.

7. The method of claim 1, wherein the step of forming the first dielectric layer includes depositing silicon dioxide.

8. The method of claim 1, wherein the step of forming the first conductive layer and the second conductive layer includes a low-pressure chemical vapor deposition method.

9. The method of claim 1, wherein the step of forming the first conductive layer and the second conductive layer includes depositing polysilicon.

10. The method of claim 9, wherein step of forming the first conductive layer and the second conductive layer includes an impurities-doping operation.

11. The method of claim 1, wherein the step of removing a portion of the photoresist layer includes an isotropic etching method.

12. The method of claim 1, wherein the step of removing a portion of the photoresist layer includes using oxygen-contained plasma.

13. The method of claim 1, wherein the step of removing the silicon dioxide layer includes using a solution such as a diluted hydrofluoric acid solution.

14. The method of claim 1, wherein the step of removing the silicon dioxide layer includes using a solution such as a buffered oxide etchant.

15. The method of claim 1, wherein the step of forming the dielectric film includes depositing silicon nitride/silicon dioxide, silicon dioxide/silicon nitride/silicon dioxide, tantalum pentoxide, PZT or BST.

16. The method of claim 1, wherein the step of forming the second conductive layer includes depositing metal.

17. The method of claim 1, wherein the step of forming the second conductive layer includes depositing titanium nitride.

18. A method for manufacturing a DRAM capacitor, wherein a substrate having a semiconductor device formed thereon is provided and the semiconductor device includes source/drain regions; moreover, above the substrate, there is a dielectric layer having a contact opening exposing one of the source/drain region, the method comprising the steps of:

forming a first conductive layer over the dielectric layer and completely filling the contact opening so that the conductive layer is electrically coupled to the exposed source/drain region;

patterning the first conductive layer using a photoresist as a mask to expose the dielectric layer;

removing a rim portion of the photoresist layer to expose a strip of area near the peripheral on the upper surface of the first conductive layer:

forming an insulating layer selectively over the dielectric layer and the conductive layer without covering the surface of the photoresist layer;

removing the photoresist layer;

removing a portion of the first conductive layer using the insulating layer as a mask to form a trench within the first conductive layer, wherein the remaining first conductive layer serves as a storage electrode of the capacitor;

removing the insulating layer and the dielectric layer;

forming a dielectric film over the exposed surface of the first conductive layer; and forming a second conductive layer over the dielectric film for serving as a cell electrode.

19. The method of claim 18 wherein the inter-layer dielectric and the dielectric layer are formed from different materials.

20. The method of claim 18, wherein the step of forming the inter-layer dielectric includes depositing silicon nitride.

21. The method of claim 18, wherein the step of forming the dielectric layer includes depositing silicon dioxide.

22. The method of claim 18, wherein the step of forming the first conductive layer and the second conductive layer includes a low-pressure chemical vapor deposition method.

23. The method of claim 18, wherein the step of forming the first conductive layer and the second conductive layer includes depositing polysilicon.

24. The method of claim 23, wherein step of forming the first conductive layer and the second conductive layer includes an impurities-doping operation.

25. The method of claim 18, wherein the step of removing a portion of the photoresist layer includes an isotropic etching method.

26. The method of claim 18, wherein the step of removing a portion of the photoresist layer includes using oxygen-contained plasma.

27. The method of claim 18, wherein the step of removing the silicon dioxide layer includes using a solution such as a diluted hydrofluoric acid solution.

28. The method of claim 18, wherein the step of removing the silicon dioxide layer includes using a solution such as a buffered oxide etchant.

29. The method of claim 18, wherein the step of forming the dielectric film includes depositing silicon nitride/silicon dioxide, silicon dioxide/silicon nitride/silicon dioxide, tantalum pentoxide, PZT or BST.

30. The method of claim 18, wherein the step of forming the second conductive layer includes depositing metal.

31. The method of claim 18, wherein the step of forming the second conductive layer includes depositing titanium nitride.

* * * * *